United States Patent
Naji

(10) Patent No.: US 6,205,073 B1
(45) Date of Patent: Mar. 20, 2001

(54) CURRENT CONVEYOR AND METHOD FOR READOUT OF MTJ MEMORIES

(75) Inventor: Peter Naji, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/540,794

(22) Filed: Mar. 31, 2000

(51) Int. Cl.[7] .................................................... G11C 7/02
(52) U.S. Cl. .................... 365/209; 365/171; 365/173; 365/148; 365/207
(58) Field of Search .................................. 365/209, 171, 365/173, 207, 210, 213, 225.5, 243.5, 148

(56) References Cited

U.S. PATENT DOCUMENTS

| | | | |
|---|---|---|---|
| 5,761,110 | * 8/2000 | Irrinki et al. | 365/100 |
| 5,774,404 | * 6/1998 | Eto | 365/222 |
| 6,097,625 | * 8/2000 | Scheuerlein | 365/171 |

* cited by examiner

*Primary Examiner*—David Nelms
*Assistant Examiner*—Connie C. Yoha
(74) *Attorney, Agent, or Firm*—William E. Koch

(57) ABSTRACT

A current conveyor for readout of a magnetic tunneling junction memory cell is coupled to a data readout line connected to at least one MTJ memory cell. The current conveyor includes a FET with a source terminal coupled to a current source and a drain terminal coupled to the data readout line. The gate terminal of the FET is connected to an output terminal of an operational amplifier connected to receive negative feedback from the data readout line and to receive a bias voltage on a second input terminal. The current conveyor has very low input impedance so that minimum data readout line swing is achieved.

23 Claims, 4 Drawing Sheets

- *PRIOR ART* -

CURRENT CONVEYOR AND METHOD FOR READOUT OF MTJ MEMORIES

FIELD OF THE INVENTION

This invention relates to MTJ memories and more particularly, to apparatus and a method for reading data stored in MTJ memories.

BACKGROUND OF THE INVENTION

Thin film Magnetic Random Access Memories (MRAMs) can be fabricated in a variety of memory cell embodiments, including a Magnetic Tunneling Junction (MTJ) cell. The MTJ cell essentially consists of a pair of magnetic layers with an insulating layer sandwiched therebetween. One of the magnetic layers has a fixed magnetic vector and the other magnetic layer has a changeable magnetic vector that is either aligned with or opposed to the fixed magnetic vector. When the magnetic vectors are aligned the resistance of the MTJ cell, i.e. the resistance to current flow between the magnetic layers, is a minimum and when the magnetic vectors are opposed or misaligned the resistance of the MTJ cell is a maximum.

Data is stored in the MTJ cell by applying a magnetic field to the MTJ cell directed so as to move the changeable magnetic vector to a selected orientation. Generally, the aligned orientation can be designated a logic 1 or 0 and the misaligned orientation is the opposite, i.e., a logic 0 or 1. Stored data is read or sensed by passing a current through the MTJ cell from one magnetic layer to the other. The amount of current passing through the MTJ cell, or the voltage drop across the MTJ cell, will vary according to the orientation of the changeable magnetic vector. Additional information as to the fabrication and operation of MTJ memory cells can be found in U.S. Pat. No. 5,702,831, entitled "Multi-Layer Magnetic Tunneling Junction Memory Cells", issued Mar. 31, 1998, and incorporated herein by reference.

In the prior art, reading data stored in MTJ cells is achieved by passing a current through a series circuit including a load resistor and the MTJ cell. The current passing through the MTJ cell is controlled by a transistor with a bias voltage on the gate, and an output voltage is obtained at a junction between the load resistor and the current controlling transistor. Also, a bitline and a data line for the MTJ cell (and other MTJ cells in the array) are clamped at a desired voltage by the transistor. There are several major problems with this type of data readout including the fact that the load resistor must be much larger than the resistance of the MTJ cell, which makes operation at low supply voltages very difficult. Also, the operation of the circuit is dependent upon the clamping voltage provided by the transistor and the bias voltage. However, the clamping voltage is a function of the resistance of the MTJ cell, the bias voltage, and the load resistance, any or all of which can vary with a specific readout process, variations in the supply voltage, changes in temperature, changes in the resistance of the MTJ cell, etc. Also, the large load resistance and the other components in this prior art circuit require large chip areas preventing the fabrication of high density memory arrays. Also, the input impedance is high due to the presence of the load resistor.

Accordingly it is highly desirable to provide apparatus and a method of reading or sensing MTJ memory cells which overcomes these problems.

BRIEF DESCRIPTION OF THE DRAWINGS

Referring to the drawings:

FIG. 1 is a schematic diagram of a prior art MTJ readout circuit;

FIG. 3 is a simplified schematic diagram of another embodiment of an MTJ readout circuit in accordance with the present invention;

DESCRIPTION OF THE PREFERRED EMBODIMENT

Figures 1, 3:
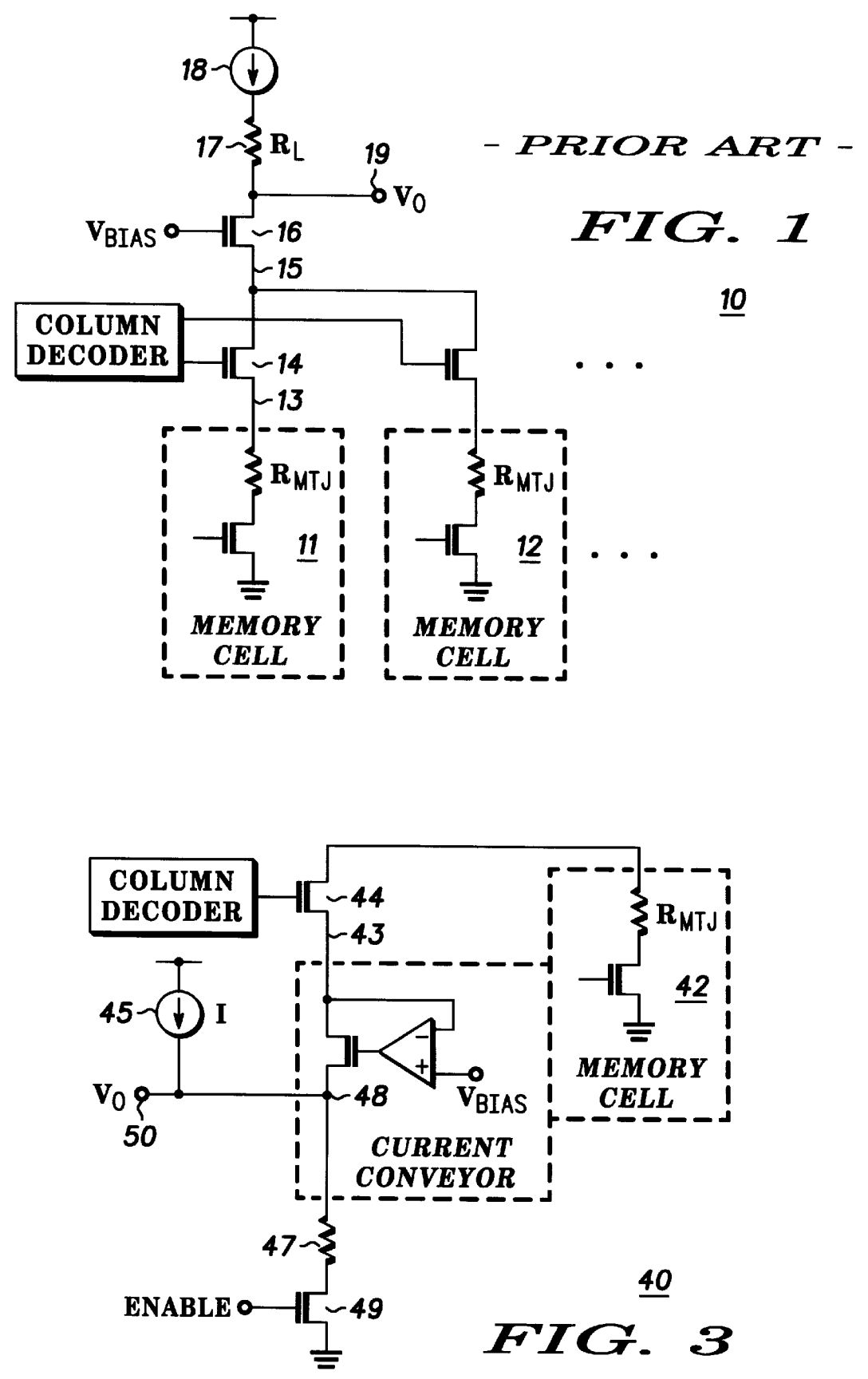
Figure 2:
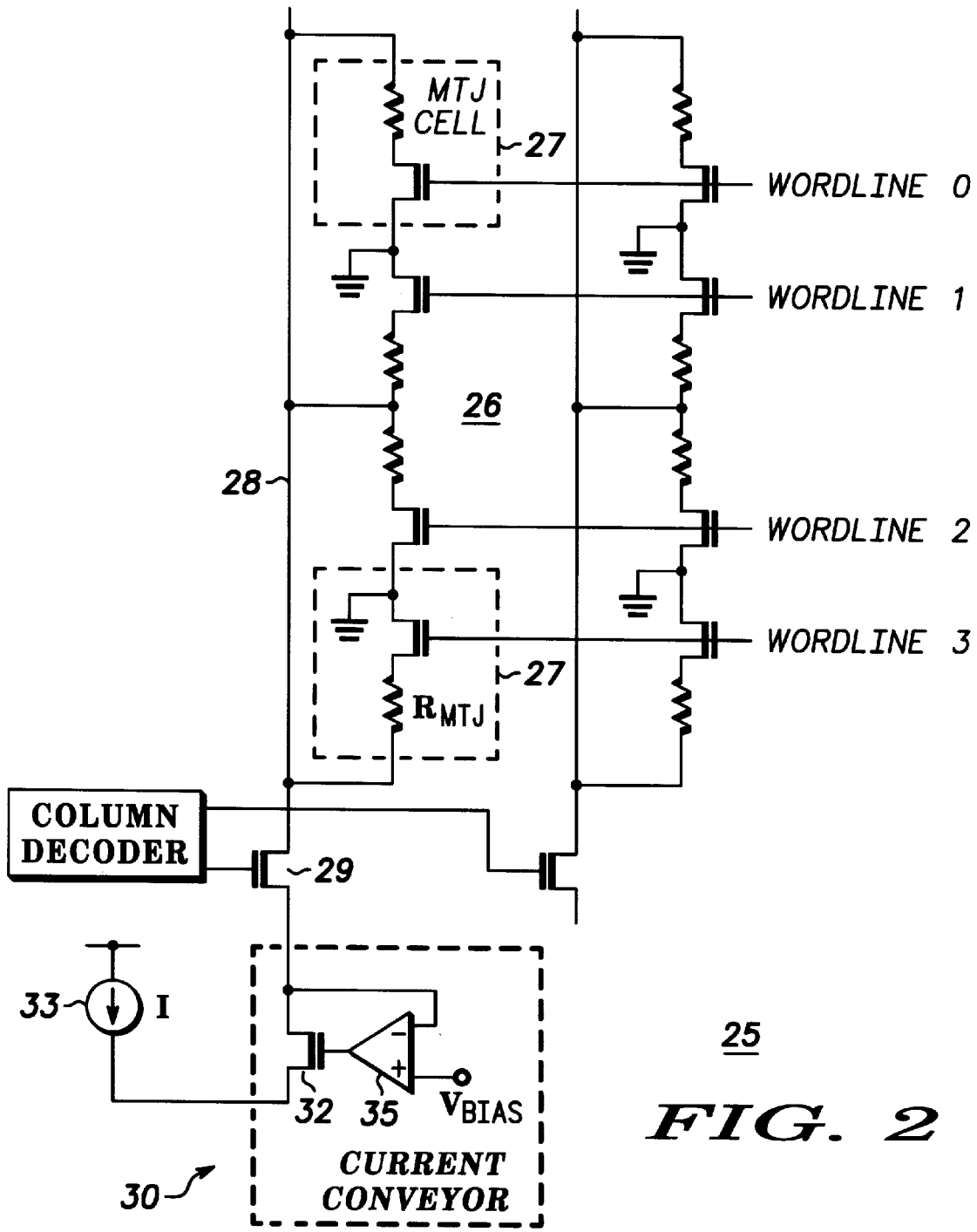
FIG. 2 is a simplified schematic diagram of an MTJ readout circuit in accordance with the present invention.

Turning now to FIG. 1, a schematic diagram of a prior art MTJ readout circuit, designated 10, is illustrated. Circuit 10 includes a plurality of magnetic tunneling junction memory cells 11, 12, etc. As is well known in the art, each cell 11, 12, etc. includes an MTJ device, represented as a resistance $R_{MTJ}$, and a control or activating transistor. Only cell 11 of the plurality of memory cells will be discussed in detail herein, since the operation of all of the cells is similar. One terminal of cell 11 is connected to a current return, such as a circuit common or ground. The other terminal of cell 11 is connected to a bit line 13 which is connected to one or more memory cells (not shown) in a well known manner. The drain of a column decode transistor 14 is connected to bitline 13 and the gate is connected to a column decoder which selects one column at a time to be readout. The source of column decode transistor 14, and all of the other column decode transistors are connected to a data line 15.

Data line 15 is connected to the drain of a transistor 16, the gate of which is connected to a bias voltage $V_{bias}$. The source of transistor 16 is connected through a load resistor 17 to a current supply 18. The source of transistor 16 is also connected to a data output terminal 19. Here it should be noted that load resistor 17 is chosen to be much larger than the resistance $R_{MTJ}$ to provide voltage gain for the circuit. Current source 18 supplies bitline current sunk by the resistance $R_{MTJ}$, depending upon its $R_{min}$ or $R_{max}$ state. Transistor 16 clamps data line 15 and the bitlines 13 at a desired voltage depending upon the bias voltage $V_{bias}$. Transistor 16 provides for low input impedance for current mode operation, since the impedance looking into transistor 16 from data line 15 is small. Additional information as to the construction and operation of prior art MTJ readout circuits of this type can be found in U.S. Pat. No. 5,793,697.

Several problems arise in this type of MTJ readout circuit, which produce a substantial deleterious effect on the operation of the memory circuit. Specifically, since load resistor 17 and memory cell 11 are connected in series in the current path of source 18, as the resistance $R_{MTJ}$ of memory cell 11 changes between $R_{min}$ and $R_{max}$ the voltage at terminals 15 and 13 changes by a more than desirable value due to the high input impedance at 15. Because these lines have a relatively high natural or inherent capacitance, large swings in the voltage require relatively long times (RC time constant of the lines) and seriously slow down readout times.

In addition, the clamping voltage (provided by transistor 16 and the voltage $V_{bias}$ applied to the gate) will vary with the readout process, the power supply (e.g. current source 18 and voltage $V_{bias}$), operating temperature, and the resistance $R_{MTJ}$ of cell 11. Large variations of the resistance $R_{MTJ}$ (i.e. a large ratio between $R_{min}$ and $R_{max}$) can render the circuit virtually useless, since voltage changes may extend beyond the operating region of the circuit. Such large variations of the resistance $R_{MTJ}$ will change the current in bitline 15 and lead to output voltage variations which are undesirable. Further, because load resistor 17 is generally included as part of the integrated circuit, a very large resistance will require large chip area. Finally, because load resistor 17 must be very large, operation of the memory at low supply voltages (e.g. 1.8 volts) is very difficult.

To overcome the above described exigencies, a current conveyor for readout of a magnetic tunneling junction memory cell is disclosed. Turning now to FIG. 2, a simplified schematic diagram is illustrated of an MTJ readout circuit 25 in accordance with the present invention. An array 26 of MTJ memory cells 27 arranged in rows and columns is illustrated. A data readout line 28, which in this embodiment is a bitline connecting a column of MTJ memory cells 27 together in a well known fashion, is connected through a column decode transistor 29 to a current conveyor designated 30. For purposes of this description, column decode transistors 29 are considered to be a part of each data readout line 28 with which they are associated, since they are simply switches included to select a specific line. Further, since the column decode transistors 29 are well known in the art and not a part of this invention, in several of the following descriptions they are omitted for simplicity.

Current conveyor 30 includes a transistor 32 (which may be, for example, a field effect transistor, an HFET, a thin film transistor, or the like) having one current terminal (e.g. the source or drain) connected to data readout line 28 and the other current terminal (e.g. the drain or source) connected to a current source 33. The control terminal or gate of transistor 32 is connected to the output terminal of an operational amplifier 35. A negative input terminal of operational amplifier 35 is connected to receive negative feedback from data readout line 28 and a positive input terminal is connected to have a bias voltage $V_{bias}$ supplied thereto. It should be noted that the negative input terminal of operational amplifier 35 has a very high (substantially infinite) input impedance so that little or no current flows from data readout line 28.

In operation, operational amplifier 35 compares the voltage $V_{bl}$ on data readout line 28 to $V_{bias}$ and by means of the negative feedback clamps $V_{bl}$ to $V_{bias}$ (since operational amplifier 35 looks essentially like a short circuit between $V_{bl}$ to $V_{bias}$), essentially providing current mode operation. Current conveyor 30 has a very low input impedance, isolating the data readout line 28 from the high output impedance of current source 33. The low input impedance combined with the clamping of $V_{bl}$ limits the voltage swing of data readout line 28 and achieves high speed readout for very high density MTJ arrays. Thus, current conveyor 30 provides and maintains a constant bias across the MTJ memory cell 27 regardless of operating temperatures, changes in the supply voltage, and process conditions. Also, current conveyor 30 provides a small swing in the voltage on data readout line 28 to allow for high speed operation. Here it should be understood that the term "operational amplifier" is a generic term for any circuit which will provide the described operation and is not limited to any specific circuit.

Here it should be noted that current source 33 provides a current equal to the current required by an MTJ memory cell 27 to yield a voltage drop of $V_{bias}$ across the cell. When the resistance $R_{MTJ}$ of MTJ memory cell 27 is minimum, current conveyor 30 will maintain $V_{bias}$ across $R_{MTJ}$ by increasing the voltage at the gate terminal of transistor 32, and when $R_{MTJ}$ goes to a maximum, current conveyor 30 will decrease the voltage at the gate terminal of transistor 32. Thus, the voltage at the gate terminal of transistor 32 is an indication of the state of MTJ memory cell 27 (i.e. the state of $R_{MTJ}$) Therefore, it can be seen that current conveyor 30 performs three functions: it clamps the voltage across $R_{MTJ}$ (the MTJ memory cell) to the desired bias voltage ($V_{bias}$); it makes a small data readout line voltage swing possible for high speed readout and low current consumption; and it is a current-to-voltage converter (i.e. the change in current is proportional to the voltage at the gate terminal of transistor 32).

Turning now to FIG. 3, a simplified schematic diagram is illustrated of another embodiment of an MTJ readout circuit, generally designated 40, in accordance with the present invention. Circuit 40 includes a current conveyor 41 coupled to at least one MTJ memory cell 42 by a data readout line 43, generally as described above. In this embodiment, data readout line 43 is a bitline and includes a column decode switch or transistor 44. Also, a current source 45 is coupled to data readout line 43 through current conveyor 41, as described above. A load resistor 47 is coupled to a junction 48 between current source 45 and current conveyor 41. Load resistor 47 is much larger than $R_{MTJ}$ of MTJ memory cell 42. An enable switch 49, illustrated herein as a transistor with the gate connected to receive an "enable" signal, couples load resistor 47 to a current return, such as ground. An output signal $V_o$ is available at a terminal 50 coupled to junction 48.

Circuit 40 has at least two advantages over MTJ readout circuit 25 of FIG. 2. Since the resistance $R_L$ of load resistor 47 is much larger than the resistance $R_{MTJ}$ of MTJ memory cell 42, small changes in the current $I_{bl}$ through data readout line 43 due to changes in the resistance $R_{MTJ}$ (i.e. $R_{min}$ to $R_{max}$ or vice versa) are amplified by load resistor 47. This feature is better understood by noting that the current I from current source 45 splits at junction 48 with part of the current, $I_{bl}$, flowing through data readout line 43 and the remainder of the current $I_L$ flowing through load resistor 47.

$$V_o=(I-I_{bl})R_L=(I-V_{bias}/R_{MTJ})R_L=I_L R_L$$

for $$R_{MTJ}=R_{min}\rightarrow I_L=I_{Lmin}$$

$$R_{MTJ}=R_{max}\rightarrow I_L=I_{Lmax}$$

$$\Delta I_L=I_{Lmax}-I_{Lmin}\rightarrow \Delta V_o=\Delta I_L R_L$$

Thus, the larger $R_L$ is the larger $\Delta V_o$ will be. A second advantage is that $V_o$ is a linear function of $V_{bias}$, since $V_{bias}$ is a linear function of I, as explained above.

Figure 4:
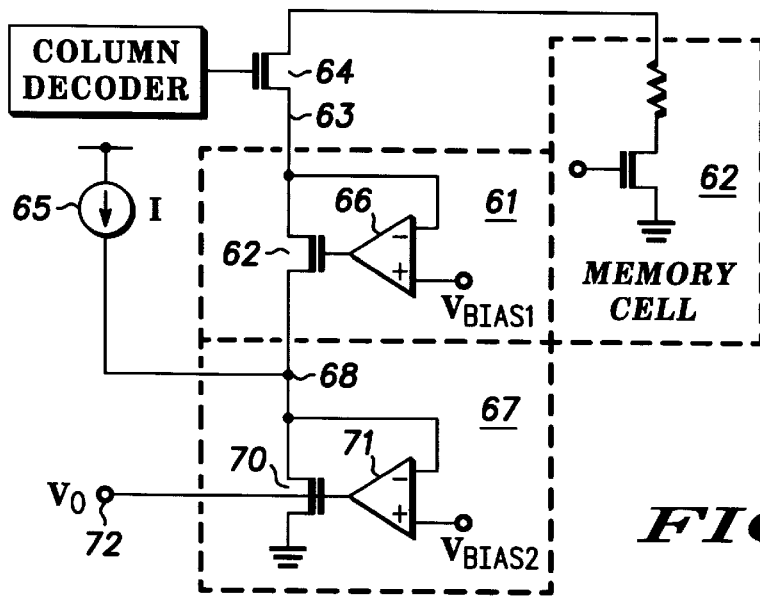
FIG. 4 is a simplified schematic diagram of another embodiment of an MTJ readout circuit in accordance with the present invention.

Turning now to FIG. 4, a simplified schematic diagram is illustrated of another embodiment of an MTJ readout circuit, generally designated 60, in accordance with the present invention. Circuit 60 includes a current conveyor 61 coupled to at least one MTJ memory cell 62 by a data readout line 63, generally as described above. Current conveyor 61 includes a transistor 62 and an operational amplifier 66 connected as described in conjunction with current conveyor 30 of FIG. 2. In this embodiment, data readout line 63 is a bitline and includes a column decode switch or transistor 64. Also, a current source 65 is coupled to data readout line 63 through current conveyor 61, as described above.

A second current conveyor 67 is coupled to a junction 68 between current source 65 and current conveyor 61. Current conveyor 67 is essentially the same as current conveyor 61 and includes a transistor 70 having a first current terminal (in this embodiment the drain terminal) connected to junction 68 and a second current terminal (the source terminal) connected to a current return, such as ground. Current conveyor 67 further includes an operational amplifier 71 having a first input terminal connected to junction 68 for negative feedback, a second input terminal connected to receive a second bias voltage $V_{bias2}$ and an output terminal connected to the gate of transistor 70. An output signal $V_o$ is available at a terminal 72 coupled to the gate of transistor 70.

MTJ readout circuit 60 has all of the advantages of MTJ readout circuits 40 and 25 plus some additional advantages. Specifically, current conveyor 61 clamps data readout line 63 to $V_{bias1}$ (the bias on the operational amplifier of current conveyor 61). In this manner, absolute changes of $R_{MTJ}$ will not change the current $I_{bl}$ in data readout line 63 and the read operation will be insensitive to $R_{MTJ}$ changes as long as the $R_{MTJ}$ variation range is within the linear range of current conveyor 61. Transistor 62 of current conveyor 61 is a source follower, that is, the impedance looking into the source terminal of transistor 62 from data readout line 63 is low. This eliminates voltage swings of data readout line 63 to a large extent and makes current mode operation possible.

In addition to the above advantages, second current conveyor 67 provides the following functions/advantages. Transistor 62 isolates data readout line 63 (bitline and dataline in this embodiment) from high impedance of current source 65 and output impedance of transistor 70, which provides a highly sensitive and high impedance at junction 68. Current conveyor 67 operates as a secondary clamp circuit and is responsible for sensing the same MTJ memory cell 62 current changes (as current sensor 61) and providing an output $V_o$ at output terminal 72. Current conveyor 67 clamps junction 68 to a predetermined voltage such that transistor 62 and current source 65, which in this embodiment is a MOSFET current, are maintained and kept in deep saturation under all process, supply, and temperature conditions, plus all variations of MTJ memory cell 62 within the linearity limits of operational amplifier 71.

Another important advantage provided by second current conveyor 67 is that, like resistor 47 in readout circuit 40 of FIG. 3, Current conveyor 67 boosts the output voltage based on changes in current caused by changes in $R_{MTJ}$ of MTJ memory cell 62. Since transistor 70 operates in deep saturation, the resistance between the drain terminal and the source terminal ($r_{ds}$) is very much greater than $R_{MTJ}$. Small changes in the current in data readout line 63 ($I_{bl}$) due to $R_{MTJ}$ resistance changes ($R_{min}$ to $R_{max}$ and vice versa) are amplified by transistor 70.

$$V_{68}=(I-I_{bl})r_{ds}=(I-V_{bias1}/R_{MTJ})r_{ds}$$

$$I-V_{bias1}/R_{MTJ}=I_{ds}$$

$$V_{68}=I_{ds}r_{ds}$$

where: $r_{ds}$ and $I_{ds}$ equal the resistance and current, respectively, between the drain and source of transistor 70.

It should be noted that the voltage at junction 68 ($V_{68}$) is clamped to $V_{bias2}$, so that the gate to source voltage ($V_{gs}$) of transistor 70 must vary in order to keep $V_{68}$ clamped. Since $V_{68}$ change (due to changes in $R_{MTJ}$) is large, $V_{gs}$ changes will be large as well.

$$\Delta V_{68}=(I_{ds(max)}-I_{ds(min)})r_{ds}$$

$$=[(I-V_{bias1}/R_{max})-(I-V_{bias1}/R_{min})]r_{ds}$$

Thus, the larger $r_{ds}$ is the larger $\Delta V_{68}$ will be.

Figure 5:
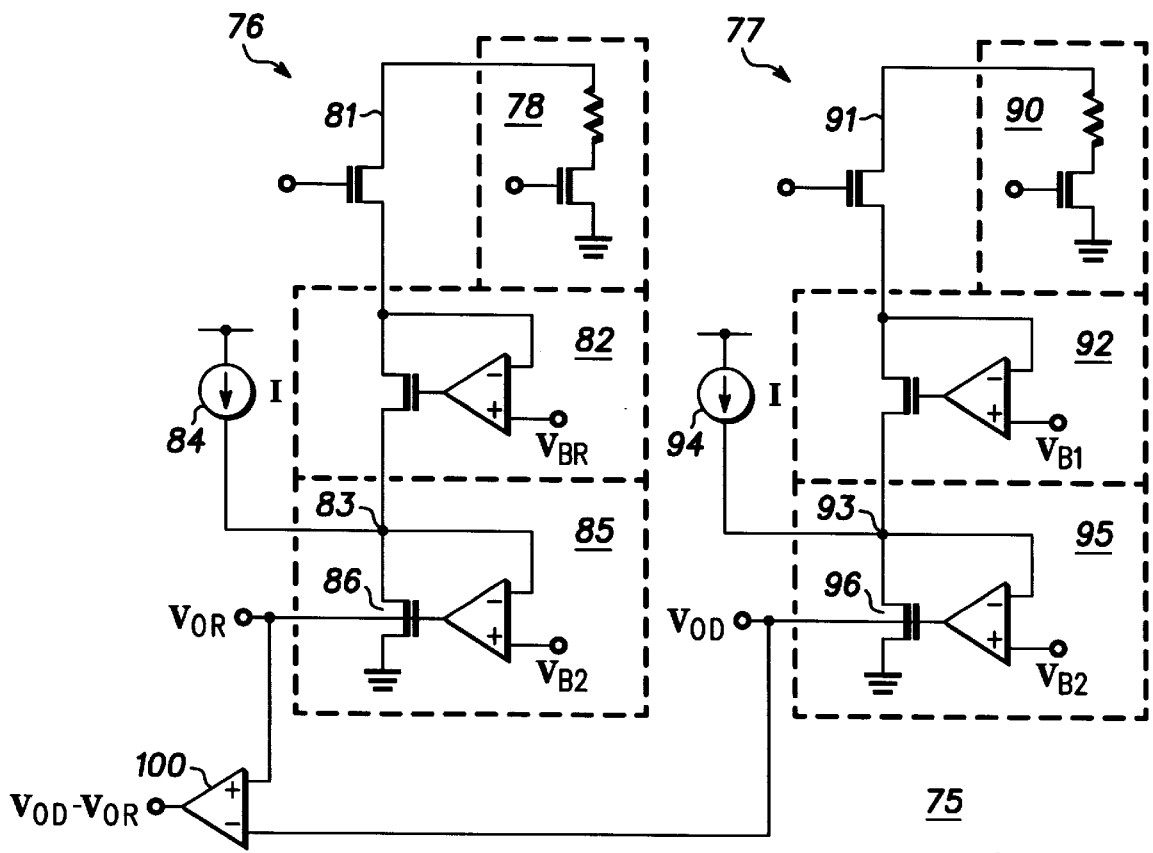
FIG. 5 is a simplified schematic diagram of a complete readout circuit incorporating the MTJ readout circuit of FIG. 4.

Most importantly, current conveyor 67 can be connected to provide an offset free output. When two MTJ readout circuits similar to circuit 60 are connected to operate differentially, as illustrated in FIG. 5, any input-referred offset at the input of operational amplifier 71 does not affect the output $V_o$. Referring additionally to FIG. 5, a simplified schematic diagram is illustrated of a differential readout circuit 75 incorporating two MTJ readout circuits 76 and 77, similar to MTJ readout circuit 60 of FIG. 4, connected in a differential fashion. In differential readout circuit 75, circuit 76 is connected to sense the current of a reference MTJ cell 78 (which will generally include a plurality of cells) and circuit 77 is connected to sense the current of a memory MTJ cell 79 (which will generally include a similar plurality of cells).

Circuit 76 includes MTJ reference cell 78 coupled by a data line 81 to a current conveyor 82. Current conveyor 82 is connected to a junction 83, which is also connected to a current source 84 and a second current conveyor 85. A reference output voltage ($V_{oR}$) is available at the gate of transistor 86 of current conveyor 85. Similarly, circuit 77 includes MTJ data memory cell 90 coupled by a data line 91 to a current conveyor 92. Current conveyor 92 is connected to a junction 93, which is also connected to a current source 94 and a second current conveyor 95. A data output voltage ($V_{oD}$) is available at the gate of transistor 96 of current conveyor 95. Both circuits 76 and 77 are connected and operate as described in conjunction with circuit 60 of FIG. 4. Reference output voltage $V_{oR}$ and data output voltage $V_{oD}$ are connected to separate inputs of a differential amplifier 100, which provides an output signal $V_{oD}-V_{oR}$.

As stated above, a major advantage of differential readout circuit 75 is that it provides an offset free output $V_{oD}-V_{oR}$. This can be better understood by referring to the following. In differential readout circuit 75, in this preferred embodiment both transistors 86 and 96 operate in saturation so that the voltage dropped across each transistor 86 and 96 is approximately equal (and is designated $V_t$ hereinafter) and the beta of each transistor 86 and 96 is approximately equal (and is designated $\beta$ hereinafter). The current flowing in transistor 86 ($I_{86}$) and in transistor 96 ($I_{96}$) is as follows:

$$I_{86}=\beta/2(V_{oR}-V_t)^2 \quad I_{96}=\beta/2(V_{oD}-V_t)^2$$

$$V_{oR}=(2I_{86}/\beta)^{1/2}+V_t \quad V_{oD}=(2I_{96}/\beta)^{1/2}+V_t$$

$$V_{oD}-V_{oR}=(2I_{96}/\beta)^{1/2}+V_t-(2I_{86}/\beta)^{1/2}-V_t$$

$$V_{oD}-V_{oR}=(2I_{96}/\beta)^{1/2}-(2I_{86}/\beta)^{1/2}$$

Thus, it can be seen that the output signal $V_{oD}-V_{oR}$ from differential amplifier 100 is independent of the voltage across the drain-source of transistors 86 and 96, which means that the output signal $V_{oD}-V_{oR}$ is not affected by offset voltages in the operational amplifiers in current conveyors 85 and 95 as long as transistors 86 and 96 are in saturation.

Figure 6:
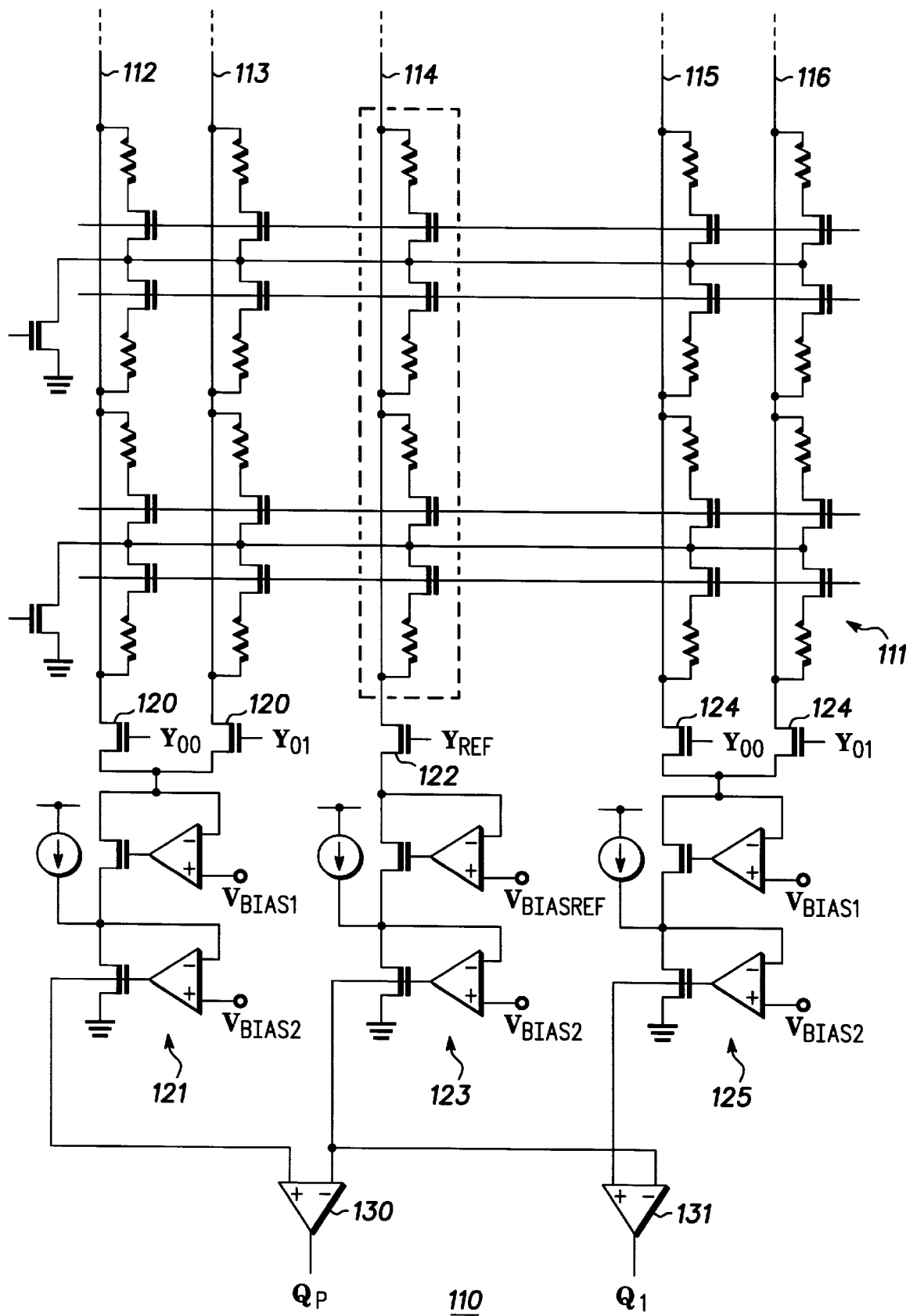
FIG. 6 is a more detailed schematic diagram of the complete readout circuit of FIG. 5.

Turning now to FIG. 6, a more detailed schematic diagram is illustrated of a complete readout circuit 110, constructed in the manner described in conjunction with differential readout circuit 75 of FIG. 5. Circuit 110 includes an array of MTJ memory cells arranged in rows and columns in a well known manner. For convenience of this description only five columns 112 through 116 are illustrated and only a small portion of each these columns is shown. Either of columns 112 or 113 is coupled through a pair of column decode transistors 120 to an MTJ readout circuit 121 (similar in construction and operation to MTJ readout circuit 60 of FIG. 4). Column 114 is coupled as a reference column through a transistor 122 to an MTJ reference circuit 123 (also similar in construction and operation to MTJ readout circuit 60 of FIG. 4). Either of columns 115 or 116 is coupled through a pair of column decode transistors 124 to an MTJ readout circuit 125 (similar in construction and operation to MTJ readout circuit 60 of FIG. 4).

Columns 112 through 116 are differentially connected by supplying a pair of differential amplifiers 130 and 131. The output signal of MTJ readout circuit 121 is supplied to the positive input of differential amplifier 130 and the reference signal from MTJ reference circuit 123 is supplied to the negative input. Similarly, The output signal of MTJ readout circuit 125 is supplied to the positive input of differential amplifier 131 and the reference signal from MTJ reference circuit 123 is supplied to the negative input. In this preferred embodiment, the value of the bias voltage applied to the first operational amplifier in the MTJ reference circuit 123 is selected so that the voltage of the reference signal from MTJ reference circuit 123 is placed at approximately the midpoint between the voltage of the output signal of MTJ readout circuit 121 and the voltage of the output signal of MTJ readout circuit 125. For all of the reasons explained above, the output voltages will retain this relationship under all process, supply, temperature, and MTJ resistance conditions.

Thus, a new and improved current conveyor is disclosed and described which greatly improves the operation and reliability of MTJ readout circuits. Because of the new and improved current conveyor, circuit operation and output signals are independent of all process, supply, temperature, and MTJ resistance conditions. Because of the new and improved current conveyor, voltage swings on data lines or bitlines are virtually eliminated so that the speed of the readout process is greatly increased. The new and improved current conveyor operates as a current-voltage converter to improve the operation and the voltage is amplified, to improve readout characteristics.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A current conveyor for readout of a magnetic tunneling junction memory cell comprising:
   a data readout line connected to at least one magnetic tunneling junction memory cell;
   a current source;
   a transistor having a control terminal, a first current terminal, and a second current terminal, the first current terminal being coupled to the current source and the second current terminal being coupled to the data readout line; and
   an operational amplifier having an output terminal connected to the control terminal of the transistor, the operational amplifier having a first input terminal connected to the data readout line and a second input terminal adapted to be coupled to a bias voltage.

2. A current conveyor for readout of a magnetic tunneling junction memory cell as claimed in claim 1 wherein the first input terminal of the operational amplifier is a negative input terminal and the second input terminal is a positive input terminal.

3. A current conveyor for readout of a magnetic tunneling junction memory cell as claimed in claim 1 wherein the transistor is a field effect transistor.

4. A current conveyor for readout of a magnetic tunneling junction memory cell as claimed in claim 1 wherein the first current terminal of the transistor is further coupled through an impedance and a semiconductor switch to a current return.

5. A current conveyor for readout of a magnetic tunneling junction memory cell as claimed in claim 4 wherein the impedance is a resistance which is larger than a resistance of the at least one magnetic tunneling junction memory cell.

6. A current conveyor for readout of a magnetic tunneling junction memory cell as claimed in claim 4 wherein the semiconductor switch is a field effect transistor with a control terminal connected to receive a data readout line enable signal.

7. A current conveyor for readout of a magnetic tunneling junction memory cell as claimed in claim 1 further including a second transistor having a control terminal, a first current terminal, and a second current terminal, the first current terminal of the second transistor being coupled to the current source and the second current terminal of the second transistor being coupled to a current return, and the cell further including a second operational amplifier having an output terminal connected to the control terminal of the second transistor, the second operational amplifier having a first input terminal connected to the current source and a second input terminal adapted to be coupled to a second bias voltage.

8. A current conveyor for readout of a magnetic tunneling junction memory cell as claimed in claim 7 wherein the first input terminal of the second operational amplifier is a negative input terminal and the second input terminal of the second operational amplifier is a positive input terminal.

9. A current conveyor for readout of a magnetic tunneling junction memory cell as claimed in claim 7 wherein the second transistor is a field effect transistor with a control terminal connected to provide a data readout signal.

10. A current conveyor for readout of a magnetic tunneling junction memory cell as claimed in claim 9 including in addition a circuit for providing a reference voltage output signal, and a comparator having a first input terminal connected to the control terminal of the second transistor and a second input terminal connected to receive the reference voltage output signal.

11. A current conveyor for readout of a magnetic tunneling junction memory cell as claimed in claim 10 wherein the circuit for providing the reference voltage output signal includes:
   a second data readout line connected to at least one magnetic tunneling junction memory cell;
   a current source;
   a third transistor having a control terminal, a first current terminal, and a second current terminal, the first current terminal of the third transistor being coupled to the current source and the second current terminal of the third transistor being coupled to the data readout line; and
   a third operational amplifier having an output terminal connected to the control terminal of the third transistor, the third operational amplifier having a first input terminal connected to the second data readout line and a second input terminal adapted to be coupled to a bias voltage.

12. A current conveyor for readout of a magnetic tunneling junction memory cell as claimed in claim 11 wherein the circuit for providing the reference voltage output signal further includes a fourth transistor having a control terminal, a first current terminal, and a second current terminal, the first current terminal of the fourth transistor being coupled to the current source and the second current terminal of the fourth transistor being coupled to a current return, and the cell further including a fourth operational amplifier having an output terminal connected to the control terminal of the fourth transistor, the fourth operational amplifier having a first input terminal connected to the current source and a second input terminal adapted to be coupled to a second bias voltage.

13. A current conveyor for readout of a magnetic tunneling junction memory cell comprising:
   a data readout line connected to at least one magnetic tunneling junction memory cell;
   a current source;
   a first transistor having a control terminal, a first current terminal, and a second current terminal, the first current terminal of the first transistor being coupled to the current source and the second current terminal of the first transistor being coupled to the data readout line; and
   a first operational amplifier having an output terminal connected to the control terminal of the first transistor, the first operational amplifier having a first input terminal connected to the first current output terminal of the first transistor and a second input terminal adapted to be coupled to a bias voltage;
   a second transistor having a control terminal, a first current terminal, and a second current terminal, the first current terminal of the second transistor being coupled to the current source and the second current terminal of the second transistor being coupled to a current return, and the cell further including a second operational amplifier having an output terminal connected to the control terminal of the second transistor, the second operational amplifier having a first input terminal connected to the current source and a second input terminal adapted to be coupled to a second bias voltage;
   a circuit for providing a reference voltage output signal; and
   a comparator having a first input terminal connected to the control terminal of the second transistor and a second input terminal connected to receive the reference voltage output signal.

14. A current conveyor for readout of a magnetic tunneling junction memory cell as claimed in claim 13 wherein the circuit for providing the reference voltage output signal includes:
   a second data readout line connected to at least one magnetic tunneling junction memory cell;
   a current source;
   a third transistor having a control terminal, a first current terminal, and a second current terminal, the first current terminal of the third transistor being coupled to the current source and the second current terminal of the third transistor being coupled to the data readout line; and
   a third operational amplifier having an output terminal connected to the control terminal of the third transistor, the third operational amplifier having a first input terminal connected to the second data readout line and a second input terminal adapted to be coupled to a bias voltage.

15. A current conveyor for readout of a magnetic tunneling junction memory cell as claimed in claim 14 wherein the circuit for providing the reference voltage output signal further includes a fourth transistor having a control terminal, a first current terminal, and a second current terminal, the first current terminal of the fourth transistor being coupled to the current source and the second current terminal of the fourth transistor being coupled to a current return, and the cell further including a fourth operational amplifier having an output terminal connected to the control terminal of the fourth transistor, the fourth operational amplifier having a first input terminal connected to the current source and a second input terminal adapted to be coupled to a second bias voltage.

16. A current conveyor for readout of a magnetic tunneling junction memory cell comprising:
   an array of magnetic tunneling junction memory cells arranged in rows and columns;
   a plurality of data readout lines associated with the array, each data readout line being connected to at least one magnetic tunneling junction memory cell of the array of cells;
   each data readout line having a current conveyor coupled thereto and each current conveyor including
      a current source,
      a transistor having a control terminal, a first current terminal, and a second current terminal, the first current terminal being coupled to the current source and the second current terminal being coupled to the data readout line, and
      an operational amplifier having an output terminal connected to the control terminal of the transistor, the operational amplifier having a first input terminal connected to the data readout line and a second input terminal adapted to be coupled to a bias voltage.

17. A current conveyor for readout of a magnetic tunneling junction memory cell as claimed in claim 16 wherein each current conveyor further includes a second transistor having a control terminal, a first current terminal, and a second current terminal, the first current terminal of the second transistor being coupled to the current source and the second current terminal of the second transistor being coupled to a current return, and the cell further including a second operational amplifier having an output terminal connected to the control terminal of the second transistor, the second operational amplifier having a first input terminal connected to the current source and a second input terminal adapted to be coupled to a second bias voltage.

18. A current conveyor for readout of a magnetic tunneling junction memory cell as claimed in claim 17 including in addition a circuit for providing a reference voltage output signal, and comparator circuitry having at least one input terminal connected to the control terminal of the second transistor of each current conveyor and a second input terminal connected to receive the reference voltage output signal.

19. A current conveyor for readout of a magnetic tunneling junction memory cell as claimed in claim 18 wherein the circuit for providing the reference voltage output signal includes one of the data readout lines of the plurality of data readout lines and the coupled current conveyor.

20. A current conveyor for readout of a magnetic tunneling junction memory cell as claimed in claim 19 wherein the comparator circuitry includes a pair of comparators each having one input terminal connected to receive the reference voltage and each having a second input terminal connected to the control terminal of the second transistor of two different current conveyors.

21. A current conveyor for readout of a magnetic tunneling junction memory cell as claimed in claim 20 wherein the reference voltage has a value such that it is approximately midway between output voltages at the control terminals of the second transistor of the two different current conveyors under operating conditions.

22. A current conveyor for readout of a magnetic tunneling junction memory cell as claimed in claim 16 wherein the first current terminal of the transistor is further coupled through an impedance and a semiconductor switch to a current return.

23. A current conveyor for readout of a magnetic tunneling junction memory cell as claimed in claim 22 wherein the impedance is a resistance which is larger than a resistance of the at least one magnetic tunneling junction memory cell.

* * * * *

UNITED STATES PATENT AND TRADEMARK OFFICE
CERTIFICATE OF CORRECTION

PATENT NO. : 6,205,073 B1 Page 1 of 1
DATED : March 20, 2001
INVENTOR(S) : Naji

It is certified that error appears in the above-identified patent and that said Letters Patent is hereby corrected as shown below:

<u>Column 1,</u>
Line 3, after the title, please add as a new first paragraph the following paragraph:
-- This invention was made with Government support under Agreement No. MDA972-96-3-0016 awarded by DARPA. The Government has certain rights in the invention. --

Signed and Sealed this

Fourth Day of November, 2003

JAMES E. ROGAN
*Director of the United States Patent and Trademark Office*